United States Patent
Lopez De Arroyabe et al.

(10) Patent No.: US 11,656,288 B2
(45) Date of Patent: May 23, 2023

(54) METHOD FOR MONITORING BATTERY CELLS OF A PRIMARY ON-BOARD ELECTRICAL SYSTEM BATTERY, ON-BOARD ELECTRICAL SYSTEM AND MOTOR VEHICLE

(71) Applicant: Bayerische Motoren Werke Aktiengesellschaft, Munich (DE)

(72) Inventors: Jose Lopez De Arroyabe, Munich (DE); Gerhard Woelfl, Geltendorf (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 17/672,969

(22) Filed: Feb. 16, 2022

(65) Prior Publication Data

US 2022/0268846 A1 Aug. 25, 2022

(30) Foreign Application Priority Data

Feb. 19, 2021 (DE) ...................... 10 2021 103 989.4

(51) Int. Cl.
| | |
|---|---|
| *G01R 31/389* | (2019.01) |
| *H02J 7/00* | (2006.01) |
| *B60L 50/60* | (2019.01) |
| *G01R 31/396* | (2019.01) |
| *G01R 31/3835* | (2019.01) |
| *B60L 58/20* | (2019.01) |

(52) U.S. Cl.
CPC ............ *G01R 31/389* (2019.01); *B60L 50/60* (2019.02); *B60L 58/20* (2019.02); *G01R 31/3835* (2019.01); *G01R 31/396* (2019.01); *H02J 7/0013* (2013.01); *H02J 7/0047* (2013.01); *H02J 7/0063* (2013.01); *B60L 2210/10* (2013.01); *H02J 2207/20* (2020.01)

(58) Field of Classification Search
CPC .. G01R 31/389; G01R 31/396; G01R 31/392; H01M 10/482; H01M 10/48; G01N 27/02; G01N 27/028; G01N 27/26
See application file for complete search history.

(56) References Cited

U.S. PATENT DOCUMENTS

| | | | |
|---|---|---|---|
| 2017/0163160 A1* | 6/2017 | Din .................. | H02J 7/0018 |
| 2018/0364311 A1 | 12/2018 | De Breucker et al. | |
| 2021/0356525 A1* | 11/2021 | Van Vroonhoven .................. | |
| | | | H01M 10/482 |

FOREIGN PATENT DOCUMENTS

WO WO-2021175623 A1 * 9/2021 ........... G01R 31/389

* cited by examiner

*Primary Examiner* — Ryan Johnson
(74) *Attorney, Agent, or Firm* — Crowell & Moring LLP

(57) ABSTRACT

A method for monitoring battery cells of a primary on-board electrical system battery of a motor vehicle by galvanostatic impedance spectroscopy is provided. An AC signal having alternating currents of different frequencies is impressed onto the battery cells as an excitation signal, cell voltage signals of the battery cells are detected as frequency-dependent response signals to the excitation signal, impedance spectra of the battery cells are determined depending on the excitation signal and the response signals, and the primary on-board electrical system battery is divided into at least two subsections each having at least one battery cell in order to provide the excitation signal. The primary on-board electrical system battery is electrically connected to a secondary on-board electrical system battery of the motor vehicle.

10 Claims, 2 Drawing Sheets

METHOD FOR MONITORING BATTERY CELLS OF A PRIMARY ON-BOARD ELECTRICAL SYSTEM BATTERY, ON-BOARD ELECTRICAL SYSTEM AND MOTOR VEHICLE

CROSS REFERENCE TO RELATED APPLICATION

This application claims priority under 35 U.S.C. § 119 from German Patent Application No. 10 2021 103 989.4, filed Feb. 19, 2021, the entire disclosure of which is herein expressly incorporated by reference.

BACKGROUND AND SUMMARY OF THE INVENTION

The invention relates to a method for monitoring battery cells of a primary on-board electrical system battery of a motor vehicle by way of galvanostatic impedance spectroscopy. Here, an AC signal having alternating currents of different frequencies is impressed onto the battery cells as an excitation signal and cell voltage signals of the battery cells are detected as frequency-dependent response signals to the excitation signal. Impedance spectra of the battery cells are determined depending on the excitation signal and the response signals. The primary on-board electrical system battery is divided into at least two subsections each having at least one battery cell in order to provide the excitation signal. The invention furthermore relates to an on-board electrical system and to an electrically driveable motor vehicle.

In the present case, interest is directed toward on-board electrical systems for electrified motor vehicles which have a rechargeable primary on-board electrical system battery. This primary on-board electrical system battery, which may be used for example as a traction battery for the motor vehicle, usually has an interconnection of a plurality of battery cells. These battery cells are intended to be monitored during the operation of the motor vehicle. To this end, it is known, for example, to monitor a cell voltage and a temperature of the battery cells by way of voltage sensors and temperature sensors on the battery cells. However, it is also desirable to monitor a dynamic behavior of the battery cells, which describes aging of the battery cells, for example. To this end, it is known from the prior art to monitor battery cells by way of impedance spectroscopy. In the case of galvanostatic impedance spectroscopy, an AC signal having alternating currents of different frequencies is impressed onto the battery cells as an excitation signal and the frequency-dependent cell voltage signal of the battery cells is detected as response signal. The impedance spectrum of the battery cells is determined from the correlation between the current signal and the cell voltage signal.

For the galvanostatic impedance spectroscopy, corresponding cell-specific exciter circuits can be provided for each battery cell, which exciter circuits can generate an excitation signal for each battery cell. However, this is very complex and associated with high costs. The excitation signal can also be generated by way of an external exciter circuit. Such a battery-external exciter circuit may be, for example, a converter, which is connected between the battery and an electrical drive machine of the motor vehicle, or a DC-DC converter, which is connected between the battery and at least one consumer of the motor vehicle. In order to generate the excitation signal, for example, switching elements of the converter or of the DC-DC converter can be actuated accordingly. However, the converter usually has a DC link capacitor for ripple damping, which is connected between the switching elements and the battery and which would undesirably smooth the generated current signal before the impression into the battery cells.

US 2018/0364311 A1 discloses a diagnostic device for a battery of a motor vehicle, which battery can be divided into a first and a second subsection. The diagnostic device is designed to extract a current from the first subsection and to feed this current at at least one frequency into the second subsection. The diagnostic device is in this case a vehicle-external, for example portable, diagnostic apparatus, which does not enable on-board diagnostics during the operation of the motor vehicle. The diagnostics can be carried out only in a workshop, for example.

It is the object of the present invention to provide a solution as to how an impedance spectroscopy can be carried out on-board and in an automated manner in order to monitor battery cells of a primary on-board electrical system battery of a motor vehicle in a simple and cost-effective manner.

This object is achieved by the claimed invention.

A method according to an embodiment of the invention is used to monitor battery cells of a primary on-board electrical system battery of a motor vehicle by way of galvanostatic impedance spectroscopy. In the method, an AC signal having alternating currents of different frequencies is impressed onto the battery cells as an excitation signal and cell voltage signals of the battery cells are detected as frequency-dependent response signals to the excitation signal. Impedance spectra of the battery cells are determined depending on the excitation signal and the response signals. The primary on-board electrical system battery is divided into at least two subsections each having at least one battery cell in order to provide the excitation signal. Furthermore, the primary on-board electrical system battery is electrically connected to a secondary on-board electrical system battery of the motor vehicle and two cycles alternating at the different frequencies are carried out. In this case, two different currents are drawn in alternation from the subsections and a secondary-side constant current formed from the two currents over the cycles is supplied to the secondary on-board electrical system battery. As an alternative or in addition, a constant current provided on the secondary side by the secondary on-board electrical system battery is provided on the primary side and two different currents formed from the constant current are supplied to the subsections in alternation, and a differential current formed on the primary side from the two currents and the direction of which alternates with the cycles is impressed onto the battery cells as the excitation signal.

The invention furthermore relates to an on-board electrical system having a primary on-board electrical system battery comprising a plurality of interconnected battery cells, a secondary on-board electrical system battery, and an on-board diagnostic device, which is set up to carry out a method according to the invention. The on-board diagnostic device for this purpose has a control apparatus, which is set up to impress an AC signal having alternating currents of different frequencies onto the battery cells as an excitation signal. The on-board diagnostic device furthermore has a measurement apparatus, which is set up to detect the cell voltage signals of the battery cells as frequency-dependent response signals to the excitation signal and to determine impedance spectra of the battery cells depending on the excitation signal and the response signals. The primary on-board electrical system battery is divided into at least two subsections each having at least one battery cell and is electrically connected to the secondary on-board electrical system battery via the control apparatus. The control apparatus is set up to carry out two cycles alternating with the different frequencies. In this case, the control apparatus is set up to draw two different currents in alternation from the subsections and to supply a secondary-side constant current formed from the two currents over the cycles to the secondary on-board electrical system battery. The control apparatus is also set up to provide a constant current provided on the secondary side by the secondary on-board electrical system battery on the primary side and to supply two different currents formed from the constant current to the subsections in alternation. The control apparatus is furthermore set up to supply or to impress a differential current formed on the primary side from the two currents and the direction of which alternates with the cycles to the battery cells of the primary on-board electrical system battery as the excitation signal.

A motor vehicle according to an embodiment of the invention comprises an on-board electrical system comprising a primary on-board electrical system and a secondary on-board electrical system. The primary on-board electrical system battery of the primary on-board electrical system is in particular a traction battery of the motor vehicle, such that the motor vehicle is designed as an electrified motor vehicle. The rechargeable primary on-board electrical system battery or the primary on-board electrical system rechargeable battery is in particular a high-voltage energy store and is designed to supply energy to at least one primary on-board electrical system component of the primary on-board electrical system, for example a high-voltage component in the form of an electrical drive machine of the motor vehicle. The rechargeable secondary on-board electrical system battery or the secondary on-board electrical system rechargeable battery of the secondary on-board electrical system is in particular a low-voltage energy store, for example a 12 V battery, and is designed to supply energy to at least one secondary on-board electrical system component of the secondary on-board electrical system. The secondary on-board electrical system may be designed for example for providing highly automated driving (HAD) of the motor vehicle and may have a low-voltage component in the form of a HAD control apparatus as the at least one secondary on-board electrical system component.

The primary on-board electrical system battery has an interconnection, for example a series circuit, of battery cells. The battery cells may be designed for example as lithium-ion cells. The primary on-board electrical system battery has in particular a center tap, via which the interconnection is divided into the at least two subsections, in particular of equal size and interconnected in series with one another. Each subsection has in particular a plurality of battery cells interconnected with one another. In order to be able to monitor the battery cells during the operation of the battery, the galvanostatic impedance spectroscopy is carried out by way of the on-board diagnostic device. The impedance spectroscopy can be used to detect or identify physico-chemical effects of the battery cell which describe a dynamic behavior of the battery cells and thus are of particular importance for the battery dynamics.

To this end, the battery cells are each loaded with an AC signal, which has alternating currents of different frequencies. The alternating currents may be sinusoidal or square-wave, for example. This AC signal represents an excitation signal for the battery cells to which a cell chemistry of the battery cells reacts. This reaction of a battery cell can be detected based on the associated frequency-dependent cell voltage signal, which is determined in particular for each battery cell as a response signal to the impressed excitation signal. To detect the cell voltage signal of a battery cell, the cell voltage of the battery cell is measured as a response to the alternating current fed to it for various frequencies, for example starting from several kilohertz down to the millihertz range. In particular the measurement apparatus of the on-board diagnostic device has a voltage sensor for each battery cell for the purpose of detecting the cell voltage signal. The impedance spectrum for this battery cell can be determined from the correlation between the frequency-dependent AC signal and the frequency-dependent cell voltage signal of a battery cell.

In order to generate the excitation signal in the form of the AC signal, the primary on-board electrical system battery is divided into the at least two subsections or battery apparatuses. The subsections are incorporated in a respective circuit via the control apparatus, wherein the flows of current in the circuits can be controlled separately. In other words, the control apparatus is designed to control a discharge and charging of the respective subsections, and thus the battery cells of the subsections. The control apparatus also couples the primary on-board electrical system to the secondary on-board electrical system. The control apparatus has in particular a DC-DC voltage conversion device, which is electrically connected to the subsections and to the secondary on-board electrical system battery and which is designed to draw the different currents or the currents with different levels from the subsections or to feed same thereto.

Currents with different levels are drawn from or supplied to the subsections per cycle via the control apparatus. In a first cycle, a first current is drawn from or supplied to the first subsection and a second current is drawn from or supplied to the second subsection. In a second cycle, the second current is drawn from or supplied to the first subsection and the first current is drawn from or supplied to the second subsection. A first and a second current is thus drawn from or supplied to each subsection in alternation so that the currents drawn from or supplied to the subsections per cycle are different but a total current that is constant over the cycles, namely the constant current, is drawn from or supplied to the primary on-board electrical system battery. The secondary on-board electrical system battery, which serves as a buffer store or intermediate store of the electrical energy drawn from the primary on-board electrical system battery, can be charged using the drawn constant current. By way of example, the at least one secondary on-board electrical system component can be supplied with this energy. The secondary on-board electrical system battery can also provide this constant current, which is transmitted to the primary on-board electrical system via the bidirectional DC-DC voltage conversion apparatus.

The alternating loading of the subsections with different currents leads to a differential current in the center tap, the direction of which differential current changes with each cycle and which differential current acts like an AC signal on the primary side in the battery cells. During a cycle, a period half of the AC signal is therefore generated. This AC signal represents the excitation signal. The cycles can be alternated at different frequencies by virtue of a period length of the individual cycles being varied. It is thus possible to provide alternating currents with different frequencies.

The method according to an embodiment of the invention is particularly advantageous since no additional exciter circuits for the battery cells have to be provided. Instead, the control apparatus, which couples the primary on-board electrical system and the secondary on-board electrical system, is used and enabled to generate the excitation signal. This saves both installation space and material costs. As a result of the fact that the electrical energy used for generating the excitation signal is transferred only between the secondary on-board electrical system battery and the primary on-board electrical system battery, the method is also of a particularly energy-efficient design.

It has proven to be advantageous if at least one frequency-dependent characteristic variable of a battery cell is determined from the impedance spectrum of the battery cell. A temperature and/or a state of charge and/or an aging of the battery cell is preferably determined as the at least one frequency-dependent characteristic variable of the battery cell. The impedance spectroscopy can thus be used to determine both a dynamic behavior of the battery cells and a static behavior of the battery cells. To this end, the impedance spectrum of a battery cell is represented as an impedance curve whose qualitative and quantitative profile can be examined and for example can be compared with a reference impedance curve. Changes in the battery cell behavior as a result of the temperature, the state of charge (SOC) and the state of health (SOH) are reflected in this impedance curve.

The DC-DC voltage conversion apparatus preferably has a first DC-DC voltage converter, the primary side of which is electrically connected to the first subsection, and a second DC-DC voltage converter, the primary side of which is electrically connected to the second subsection, wherein the DC-DC voltage converters can be electrically interconnected on the secondary side with one another and with the secondary on-board electrical system battery. A first circuit having the first DC-DC voltage converter and the first subsection and a second circuit having the second DC-DC voltage converter and the second subsection are thus formed. Different currents may circulate in these two circuits. The use of two DC-DC voltage converters also has the advantage that, in the event of a fault in one subsection of the primary on-board electrical system battery, the secondary on-board electrical system battery can be supplied with energy from the respective other fault-free subsection via the associated DC-DC voltage converter. The DC-DC voltage converters thus provide redundancy, by way of which a degree of reliability, for example for the HAD control units, can be provided.

The embodiments presented with reference to the method according to the invention and the advantages thereof apply accordingly to the on-board electrical system according to the invention and to the motor vehicle according to the invention.

Further features of the invention may emerge from the claims, the figures and the description of the figures. The features and combinations of features mentioned above in the description and the features and combinations of features mentioned below in the description of the figures and/or shown in the figures alone can be used not only in the respectively stated combination, but also in other combinations or alone.

The invention is now explained in more detail based on an exemplary embodiment and with reference to the drawings.

DETAILED DESCRIPTION OF THE DRAWINGS

Identical or functionally identical elements are provided with the same reference signs in the figures.

Figure 1:
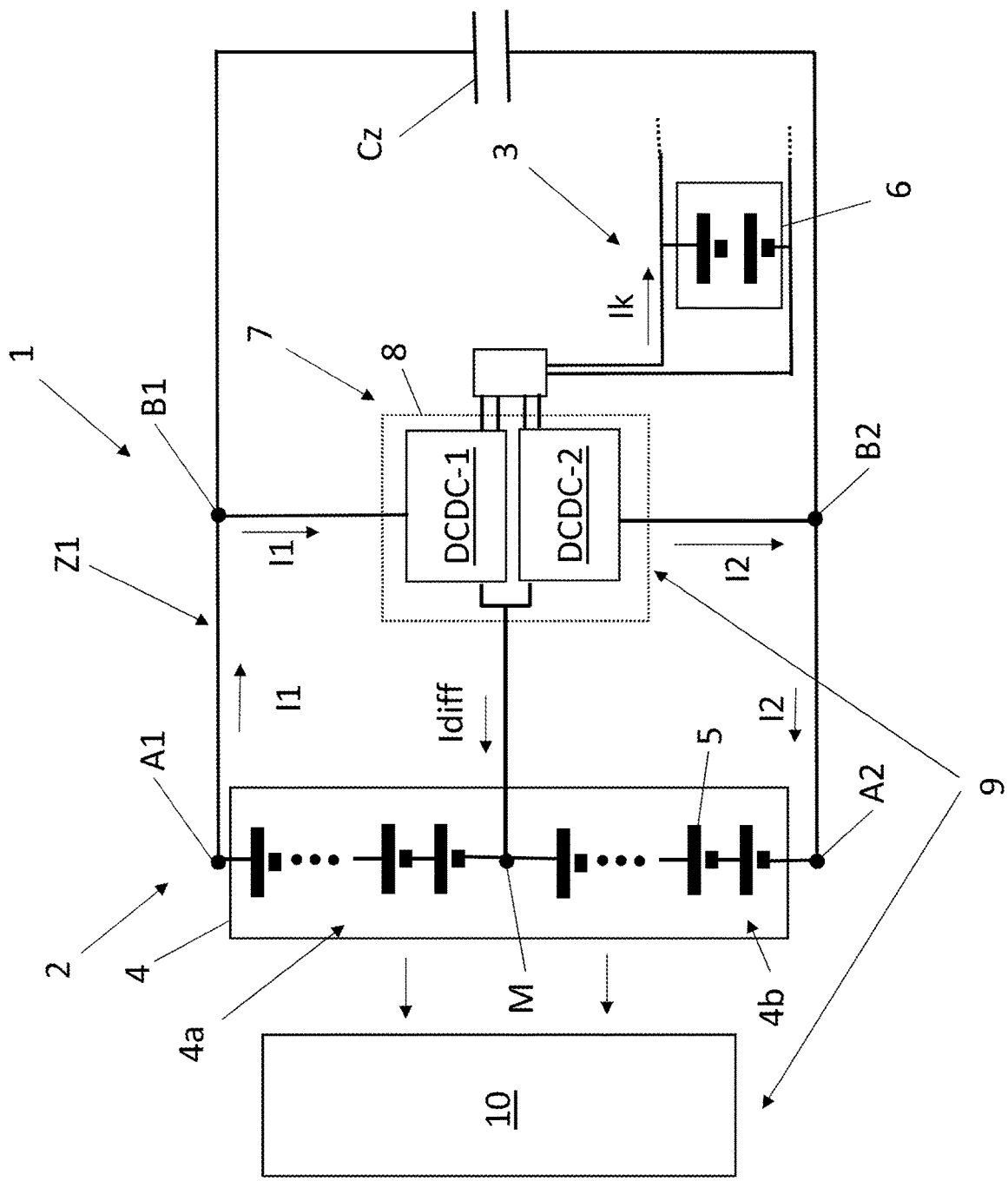
FIG. 1 shows an illustration of an embodiment of an on-board electrical system during a first cycle.
Figure 2:
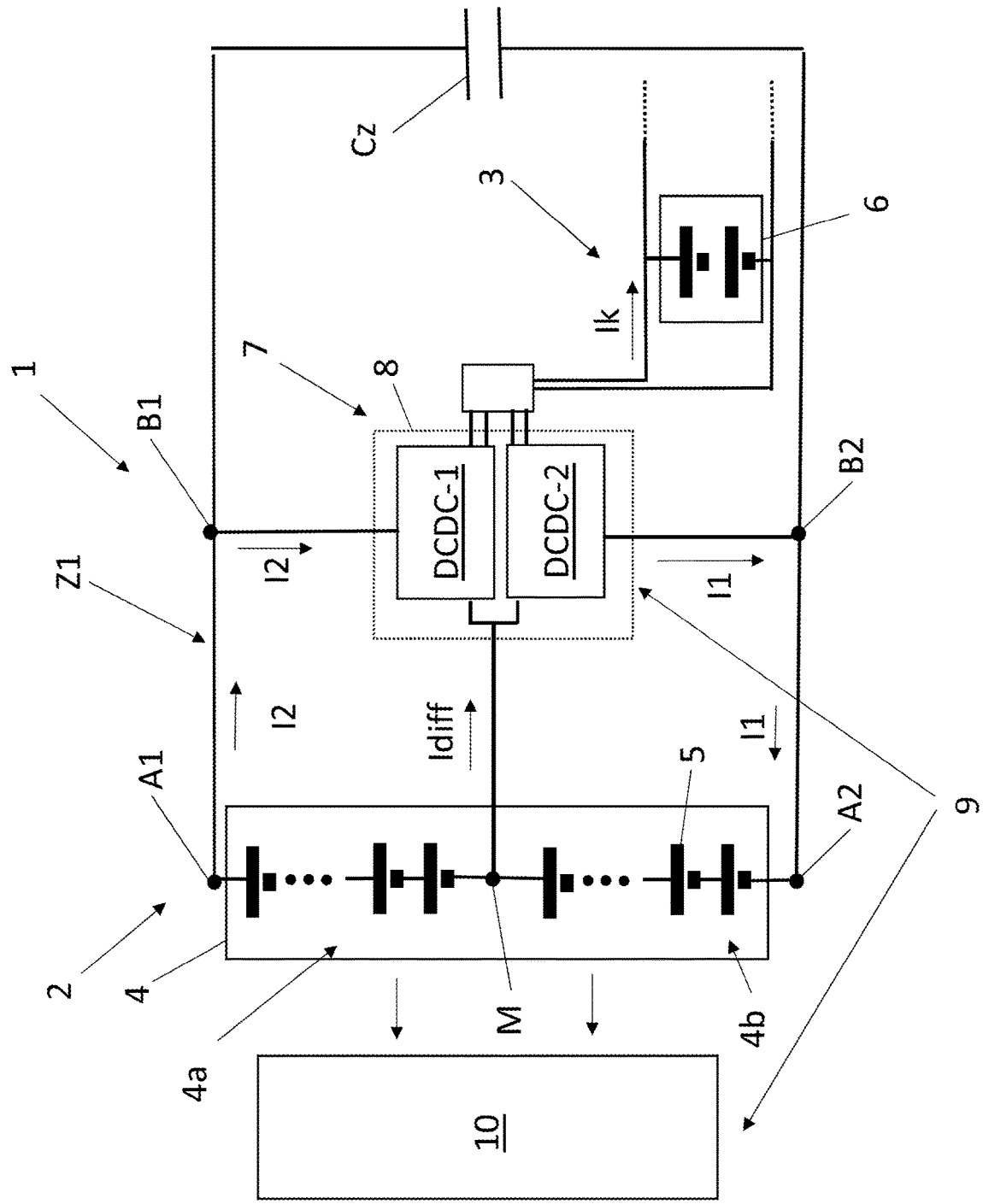
FIG. 2 shows the on-board electrical system in accordance with FIG. 1 during a second cycle.

FIGS. 1 and 2 show an on-board electrical system 1 for a motor vehicle. The on-board electrical system 1 has a primary on-board electrical system 2 and a secondary on-board electrical system 3. The primary on-board electrical system 2 has a primary on-board electrical system battery 4, which can be used for example as a traction battery for the motor vehicle designed as an electrical or hybrid vehicle. The primary on-board electrical system battery 4 is designed here as a high-voltage battery and is electrically connected to at least one high-voltage consumer of the on-board electrical system 1, for example an electrical drive machine of the motor vehicle. The primary on-board electrical system battery 4 is divided here into two subsections 4a, 4b via a center tap M, which subsections each have an interconnection of battery cells 5. The secondary on-board electrical system 3 has a secondary on-board electrical system battery 6, which is designed in particular as a low-voltage battery and is set up to supply electrical energy to at least one low-voltage consumer, for example at least one control unit for autonomous driving.

The primary on-board electrical system 2 and the secondary on-board electrical system 3 are electrically interconnected via a control apparatus 7, which in this case has a DC-DC voltage conversion apparatus 8. The DC-DC voltage conversion apparatus 8 has a first DC-DC voltage converter DCDC-1, the primary side of which, that is to say the side of the primary on-board electrical system 2, is electrically connected to the first subsection 4a of the primary on-board electrical system battery 4 via a first connection point A1 of the primary on-board electrical system battery 4 and the center tap M of the primary on-board electrical system battery 4, and a second DC-DC voltage converter DCDC-2, the primary side of which is electrically connected to the second subsection 4b of the primary on-board electrical system battery 4 via a second connection point A2 of the primary on-board electrical system battery 4 and the center tap M. The DC-DC voltage converters DCDC-1, DCDC-2 are electrically connected on the secondary side, that is to say on the side of the secondary on-board electrical system 3, to one another and to the secondary on-board electrical system battery 6. The DC-DC voltage converters DCDC-1, DCDC-2 form a redundancy. If at least one battery cell 5 in one of the subsections 4a, 4b, for example in the second subsection 4b, has a fault, the secondary on-board electrical system battery 6 can continue to be supplied with energy from the first subsection 4a via the first DC-DC voltage converter DCDC-1. The DC-DC voltage conversion apparatus 8 is also electrically connected to a DC link capacitor Cz of the primary on-board electrical system 2 via two connection points B1, B2.

The control apparatus 7 having the DC-DC voltage conversion apparatus 8 is also part of an on-board diagnostic device 9, via which the battery cells 5 can be monitored during the operation of the primary on-board electrical system battery 4, for example during a driving operation of the motor vehicle. To this end, at least one frequency-dependent, battery-dynamic characteristic variable of the battery cells 5, for example a temperature and/or a state of charge and/or an aging of the battery cells 5, is determined. For this purpose, the on-board diagnostic device 9 is set up to monitor the battery cells 5 of the primary on-board electrical system battery 4 by way of galvanostatic impedance spectroscopy. The on-board diagnostic device 9 also comprises a measurement apparatus 10 in addition to the control apparatus 7.

In order to carry out the impedance spectroscopy, the control apparatus 7 can impress an excitation signal in the form of an AC signal having alternating currents onto the battery cells 5. The excitation signal generates a voltage drop at the battery cells 5, which can be detected by the measurement apparatus 10. The measurement apparatus 10 is an impedance spectroscopy measurement unit and has in particular for each battery cell 5 a voltage sensor for detecting a cell voltage signal of the associated battery cell 5. The measurement apparatus 10 in this case detects the cell voltage signal at each battery cell 5 as a response signal of the battery cell to the excitation signal. An evaluation unit of the measurement apparatus 10 is set up to determine an impedance spectrum for each battery cell 5 from the cell voltage signal and the AC signal. To this end, the impedance of the battery cell 5 is determined at the various frequencies of the excitation signal. The battery-dynamic characteristic variables of a battery cell 5 can be determined from the impedance spectrum of this battery cell 5 and monitored.

To generate the excitation signal, two cycles Z1, Z2 are carried out in alternation, wherein a first cycle Z1 is shown in FIG. 1 and a second cycle Z2 is shown in FIG. 2. In each cycle Z1, Z2, a period half of the, for example sinusoidal or square-wave, alternating current is generated for the excitation signal. To vary the frequencies of the alternating currents of the excitation signal, the time periods of the cycles Z1, Z2 are varied. During the first cycle Z1, a first current I1, for example 20 A, is drawn from the first subsection 4a via the first DC-DC voltage converter DCDC-1 and a second current I2, different from the first current I1, for example 10 A, is drawn from the second subsection 4b via the second DC-DC voltage converter DCDC-2. The battery cells 5 of the first subsection 4a are thus discharged during the first cycle Z1 for example at 20 A and the battery cells 5 of the second subsection 4b are discharged at 10 A. During the second cycle Z2, the second current I2 is drawn from the first subsection 4a via the first DC-DC voltage converter DCDC-1 and the first current I1 is drawn from the second subsection 4b via the second DC-DC voltage converter DCDC-2. The battery cells 5 of the first subsection 4a are thus discharged during the second cycle at 10 A and battery cells 5 of the second subsection 4b are discharged at 20 A. The different loading of the subsections 4a, 4b during a cycle Z1, Z2 can be realized in a simple manner by the actuation of the DC-DC voltage converters DCDC-1 and DCDC-2.

Since both subsections 4a, 4b in particular have the same voltage level, for example 400 V, the same total power is provided by the primary on-board electrical system battery 4 in both cycles Z1, Z2. In the first cycle Z1, by way of example the partial power 400 V*20 A=8 kW is provided by the first subsection 4a and the partial power 400 V*10 A=4 kw is provided by the second subsection 4b, that is to say a total of 12 kW total power. In the second cycle Z2, the partial power 400 V*10 A=4 kW is provided by the first subsection 4a and the partial power 400 V*20 A=8 kW is provided by the second subsection, that is to say likewise a total of 12 kW total power. When viewed over the cycles Z1, Z2, a constant total current is thus drawn from the primary on-board electrical system battery 4, which constant total current is supplied to the secondary on-board electrical system battery 6 of the secondary on-board electrical system 3 as a constant current Ik.

As an alternative thereto, the subsections 4a, 4b could also be charged using the different currents I1, I2 in the different cycles Z1, Z2. By way of example, during the first cycle Z1, the first subsection 4a can be charged using the first current I1 and the second subsection 4b can be charged using the second current I2. During the second cycle Z2, the first subsection 4a is charged using the second current I2 and the second subsection 4b is charged using the first current I1. To provide the charging currents I1, I2, a current Ik that is constant over the cycles Z1, Z2 is drawn from the secondary on-board system battery 6 and transmitted to the primary on-board electrical system 2 via the DC-DC voltage converters DCDC-1 and DCDC-2. It is also possible for the constant current Ik=0 A and for the secondary on-board electrical system battery 6 to be used only as a buffer store.

The loading of the subsections 4a, 4b that is different during a cycle Z1, Z2 leads to a differential current Idiff in the center tap M, in this case for example at an amplitude level of 10 A, which changes its direction with the cycles Z1, Z2. This current Idiff thus acts as an alternating current in the battery cells 5 and therefore represents the excitation signal. This AC signal generates the voltage drop in the battery cells 5 that can be detected by the measurement apparatus 10. An excitation of the battery cells 5 of this kind advantageously does not cause any or hardly any ripple in components of the primary on-board electrical system 2 which are connected to the connection points B1, B2, that is to say for example in the DC link capacitor Cz.

Owing to the transfer of the energy from the primary on-board electrical system 2 to the secondary on-board electrical system 3, excitation of the battery cells 5 for the impedance spectroscopy and at the same time supply of the secondary on-board electrical system 3 can be provided in a cost-effective and energy-efficient manner.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for monitoring battery cells of a primary on-board electrical system battery of a motor vehicle by galvanostatic impedance spectroscopy, the method comprising:
    impressing an AC signal having alternating currents of different frequencies onto the battery cells as an excitation signal,
    detecting cell voltage signals of the battery cells as frequency-dependent response signals to the excitation signal,
    determining impedance spectra of the battery cells depending on the excitation signal and the response signals, and
    dividing the primary on-board electrical system battery into at least two subsections each having at least one battery cell in order to provide the excitation signal, wherein:
    the primary on-board electrical system battery is electrically connected to a secondary on-board electrical system battery of the motor vehicle,
    two cycles alternating at the different frequencies are carried out, in which at least one of:

two different currents are drawn in alternation from the subsections and a secondary-side constant current formed from the two currents over the cycles is supplied to the secondary on-board electrical system battery, or a constant current provided on the secondary side by the secondary on-board electrical system battery is provided on the primary side and two different currents formed from the constant current are supplied to the subsections in alternation, and a differential current formed on the primary side from the two currents is supplied to the battery cells as the excitation signal, wherein the direction of the differential current alternates with the cycles.

2. The method according to claim 1, wherein at least one frequency-dependent characteristic variable of one of the battery cells is determined from the impedance spectrum of the battery cell.

3. The method according to claim 2, wherein at least one of a temperature, a state of charge, or an aging of the battery cell is determined as at least one frequency-dependent characteristic variable of the battery cell.

4. An on-board electrical system comprising:
a primary on-board electrical system battery comprising a plurality of interconnected battery cells,
a secondary on-board electrical system battery,
a vehicle-internal on-board diagnostic device,
a control apparatus, which is configured to impress an AC signal having alternating currents of different frequencies onto the battery cells as an excitation signal, and
a measurement apparatus, which is configured to detect cell voltage signals of the battery cells as frequency-dependent response signals to the excitation signal and to determine impedance spectra of the battery cells depending on the excitation signal and the response signals, wherein:
the primary on-board electrical system battery is divided into at least two subsections each having at least one battery cell and is electrically connected to the secondary on-board electrical system battery via the control apparatus,
the control apparatus is configured to carry out two cycles alternating with the different frequencies,
the control apparatus is further configured to at least one of:
draw two different currents in alternation from the subsections and supply a secondary-side constant current formed from the two currents over the cycles to the secondary on-board electrical system battery, or provide a constant current provided on the secondary side by the secondary on-board electrical system battery on the primary side and to supply two different currents formed from the constant current to the subsections in alternation, and the control apparatus is further configured to supply a differential current formed on the primary side from the two currents and the direction of which alternates with the cycles to the battery cells of the primary on-board electrical system battery as the excitation signal.

5. The on-board electrical system according to claim 4, wherein the control apparatus has a DC-DC voltage conversion apparatus, which is electrically connected to the subsections and to the secondary on-board electrical system battery, and the DC-DC voltage conversion apparatus is configured to at least one of:
draw the different currents from the subsections, feed the different currents to the subsections same thereto and feed the constant current to the secondary on-board electrical system battery, or draw the different currents from the subsections.

6. The on-board electrical system according to claim 5, wherein
the DC-DC voltage conversion apparatus has a first DC-DC voltage converter, the primary side of which is electrically connected to the first subsection, and a second DC-DC voltage converter, the primary side of which is electrically connected to the second subsection, and
the DC-DC voltage converters are electrically interconnectable on the secondary side to one another and to the secondary on-board electrical system battery.

7. The on-board electrical system according to claim 4, wherein the primary on-board electrical system battery has a center tap, via which the primary on-board electrical system battery is divided into the two subsections.

8. The on-board electrical system according to claim 4, wherein:
the primary on-board electrical system battery is configured as a high-voltage battery for supplying at least one high-voltage component of the motor vehicle, and
the secondary on-board electrical system battery is configured as a low-voltage battery for supplying at least one low-voltage component of the motor vehicle.

9. The on-board electrical system according to claim 4, wherein the primary on-board electrical system battery is configured as a traction battery for driving the motor vehicle.

10. A motor vehicle comprising the on-board electrical system according to claim 4.

* * * * *